United States Patent
Schulz (10) Patent No.: US 10,491,199 B2
(45) Date of Patent: Nov. 26, 2019

(54) METHOD FOR OPERATING A PULSE GENERATOR FOR CAPACITIVE SENSORS, AND PULSE GENERATOR

(71) Applicant: IFM ELECTRONIC GMBH, Essen (DE)

(72) Inventor: Jörg Schulz, Tettnang (DE)

(73) Assignee: IFM ELECTRONIC GMBH, Essen (DE)

(*) Notice: Subject to any disclaimer, the term of this patent is extended or adjusted under 35 U.S.C. 154(b) by 88 days.

(21) Appl. No.: 15/549,869

(22) PCT Filed: Jan. 14, 2016

(86) PCT No.: PCT/EP2016/050610
§ 371 (c)(1),
(2) Date: Aug. 9, 2017

(87) PCT Pub. No.: WO2016/128164
PCT Pub. Date: Aug. 18, 2016

(65) Prior Publication Data
US 2018/0034451 A1 Feb. 1, 2018

(30) Foreign Application Priority Data

Feb. 12, 2015 (DE) .................. 10 2015 202 510
Apr. 30, 2015 (DE) .................. 10 2015 208 060

(51) Int. Cl.
*H03K 17/28* (2006.01)
*H03K 5/06* (2006.01)
(Continued)

(52) U.S. Cl.
CPC .............. *H03K 5/06* (2013.01); *H03K 5/05* (2013.01); *H03K 5/26* (2013.01); *H03K 2005/00026* (2013.01); *H03K 2005/00058* (2013.01)

(58) Field of Classification Search
CPC ....................................................... H03K 5/06
(Continued)

(56) References Cited

U.S. PATENT DOCUMENTS 6,452,514 B1 9/2002 Philipp
7,411,427 B1 8/2008 Fong
(Continued)

FOREIGN PATENT DOCUMENTS

DE 10359441 A1 4/2005
EP 1385266 A1 1/2004
EP 2629419 A1 8/2013

*Primary Examiner* — Metasebia T Retebo
(74) *Attorney, Agent, or Firm* — Harness, Dickey & Pierce, P.L.C.

(57) ABSTRACT

The disclosure relates to a method for operating a pulse generator for generating measuring pulses for a capacitive sensor having an adjustable pulse time in the range from 10 ns to 200 ns, having a controllable delay circuit which contains a first integrating RC combination (RT1/CT1) and a second integrating RC combination (RT2/CT2), having a logical combining element having two inputs and one output, an initialization circuit and a control unit, wherein the first input of the logical combining element receives a clock signal, and the second input of the logical combining element receives an analog setting signal (SSE) from the output of the delay circuit, wherein two simultaneous clock signals are generated, of which the first clock signal (T) is led without delay to the first input of the logical combining element, and the second clock signal (T2), delayed by the delay circuit, is led to the second input of the logical combining element, time-variable output pulses are generated with the aid of time-variable preloading signals (VL), wherein the output from the delay circuit after each measuring pulse is discharged or charged by the initialization switch.

7 Claims, 6 Drawing Sheets

(51) Int. Cl.
*H03K 5/05* (2006.01)
*H03K 5/26* (2006.01)
*H03K 5/00* (2006.01)

(58) Field of Classification Search
USPC .......................................................... 327/392
See application file for complete search history.

(56) References Cited

U.S. PATENT DOCUMENTS

| | | |
|---|---|---|
| 2004/0032301 A1 | 2/2004 | Schultheiss et al. |
| 2010/0259284 A1* | 10/2010 | Winkens .................. G01D 1/00 324/679 |
| 2011/0080201 A1 | 4/2011 | Yang et al. |
| 2014/0062217 A1 | 3/2014 | Corbe et al. |
| 2015/0160277 A1* | 6/2015 | Seo ........................... G01D 5/24 324/686 |
| 2016/0118981 A1* | 4/2016 | Lim ..................... H03K 17/955 327/517 |

* cited by examiner

METHOD FOR OPERATING A PULSE GENERATOR FOR CAPACITIVE SENSORS, AND PULSE GENERATOR

CROSS-REFERENCE TO RELATED APPLICATIONS

This application is a National Stage of International Application No. PCT/EP2016/050610, filed on Jan. 14, 2016, and published in German as WO2016/128164 A1 on Aug. 18, 2016. This application claims the priority to German Patent Application No. 102015202510.1, filed on Feb. 12, 2015 and German Patent Application No. 102015208060.9, filed on Apr. 30, 2015. The entire disclosures of the above applications are incorporated herein by reference.

FIELD

The disclosure, relates to a method for operating a pulse generator for capacitive sensors according to the preamble of claim 1, as well as a pulse generator for a capacitive sensor.

BACKGROUND

This section provides background information related to the present disclosure which is not necessarily prior art.

In addition, a so-called front circuit for a capacitive sensor comprising the pulse generator according to the disclosure is provided.

Capacitive sensors are widely spread not only in the automation technology, but more recently also in the automotive industry, where they find application, inter alia, as trunk or door opener or in seat occupancy detection.

They have at least one electrode capacitance which can be influenced from the outside, the electrodes of which are supplied with a high frequency alternating current. The changes in capacitance caused by an object entering into the alternating electric field are usually converted into a pulse of variable length in order to improve the further processing. This kind of devices are also manufactured and sold by the applicant.

In order to avoid faulty operations, a plurality of electrodes are used which allow a more accurate analysis of the situation. For example, rain, snow or falling leaves or unintentional human influences, such as passing people, must be clearly distinguished from a hand or a foot approaching in a defined way.

Such a capacitive sensor arrangement including a charge pulse output is referred to in the literature as front-end electronics.

For its operation it requires a pulse generator for generating short electrical pulses. A suitable pulse generator is shown in DE 103 59 441 A1.

Here, however, the pulse duration is not adjustable, which is disadvantageous in realizing different measuring tasks with different pulse lengths.

In addition, this circuit is not suitable for driving digital components, which is also regarded as a disadvantage.

A circuit for adjusting the pulse width of the clock signal for a microprocessor called "impulse width timing circuit" is shown in US 2011/0 080 201 A1. Here a square-wave input signal is supplied to two complementary RC elements. Herein, complementary means that a capacitance can be recharged quickly via a first resistance path and slowly via a second resistance path acting reversely. In the above-mentioned document, a variable delay time is set by a variable capacitance and a pulse duration by variable capacitances and/or resistances. The tuneable resistances and capacitances are considered as disadvantageous.

SUMMARY

This section provides a general summary of the disclosure, and is not a comprehensive disclosure of its full scope or all of its features.

It is the object of the disclosure to provide a method for generating variable pulses for capacitive sensors, as well as a pulse generator with adjustable pulse duration which is universally useable for various measuring tasks that avoid these disadvantages. In particular variable resistances and capacitances are to be dispensed with. In addition, the pulse generator should also be suited for driving digital components.

The essential idea of the disclosure is to generate a clock signal and to supply this clock signal on two different signal paths T1, T2 to a logic gate 3, wherein the first signal path T1 does not significantly delay the clock signal and the second signal path T2 includes a delay circuit 2. The delay circuit 2 includes a first integrating RC element with a short delay time constant RT1, CT1 in the time range between 10 ns and 200 ns. Moreover, the delay circuit 2 includes a second integrating RC element with a second, longer precharge time constant RT2, CT2 with a value of greater than 1 μs. This RC element is precharged with a precharge signal VL, to thereby produce a controllable bias voltage, whereby the resulting pulse duration becomes time-controllable. The delay circuit is cyclically discharged and charged, respectively, by an initialization switch S1 at its output to restore a defined initial state.

The logic gate 3 has two inputs and one output LVA at which the pulse to be generated occurs.

Thus, the pulse generator according to the disclosure is suitable for a so-called front circuit for capacitively detecting the distance, the speed or the position of an object. This has at least two electrode capacitances coupled to one another, the charge of which is transferred in known manner to a charge pulse output.

In a motor vehicle, this may be a seat occupancy sensor, a capacitive door opener or even a tailgate opener.

The measured values can be used to generate a binary switch signal or to generate binary or analog diagnostic signals which may be transmitted over a bus interface.

The disclosure will be explained in more detail with reference to the drawing.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
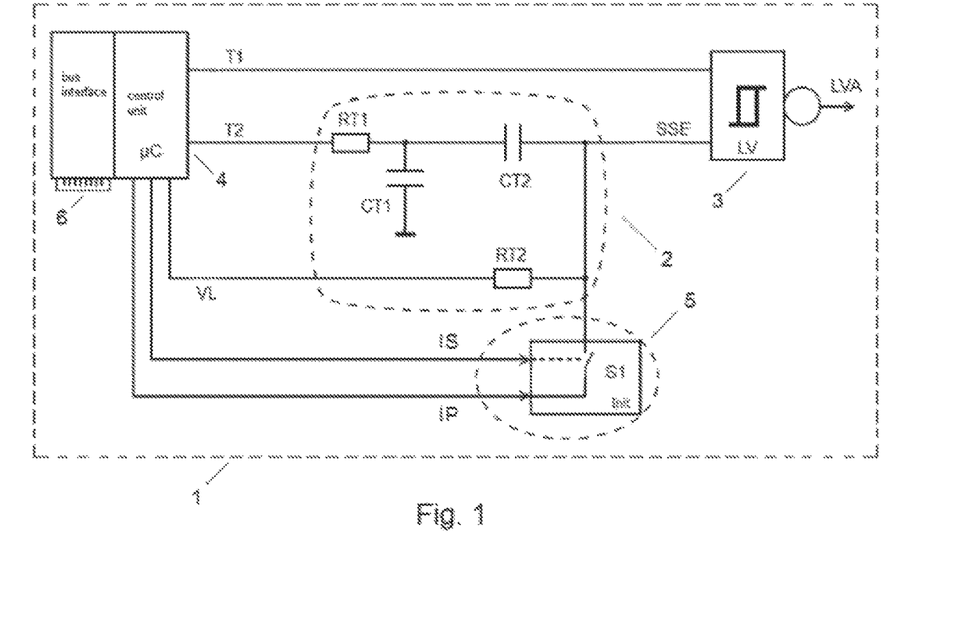
FIG. 1 shows a pulse generator 1 according to the disclosure.

A pulse generator 1 according to the disclosure has the following features or components:
- a clock generation unit which generates two simultaneous clock signals,
- a logic gate 3 with two inputs and one output,
- the first clock signal input is connected to the first input of the logic gate 3,
- the second clock signal input is connected to a first input of a delay circuit,
- the delay circuit includes the following sub-components:
  - a first RC element having a first, shorter integrating delay time constant RC1, CT1 in the time range 10 ns to 200 ns;
  - a second RC element having a second, larger integrating precharge time constant RT2, CT2 in the time range of greater 1 μs which is precharged by an adjustable precharge signal VL,
- the output of the delay circuit 2 is connected to the second input of the logic gate 3,
- the second input of the logic gate 3 is configured to operate as a threshold switch,
- the output of the logic gate 3 is connected to the corresponding control input of the capacitive sensor circuit,
- an initialization switch S1 for cyclically restoring a defined initial state,
- a control unit 4 (microcontroller) which provides the following output signals:
  - at least one clock signal which is connected to the input T1,
  - optionally a further clock signal which is connected to the input T2,
  - a precharge signal which is connected to the input VL of the delay circuit,
  - a control signal IS for the initialization switch which is connected to the control input of the initialization switch,
  - optionally a control signal IP which specifies the voltage potential of the initialization switch.

The second clock signal can be generated directly by the control unit 4 or optionally by simple logical inversion of the first clock signal. The basic mode of operation of the pulse generator 1 according to the disclosure is not changed thereby.

The initialization switch S1, also designated with 5, may be embodied as a discrete component, for example as an analog switch or a switching transistor, or may be internally integrated in the control unit. In this case, the control signal for the initialization switch S1 is only generated internally within the control unit 4. However, in the following figures this switch is shown as a component in order to illustrate the function.

The set direction of operation of the initialization switch S1 towards ground or towards the operating voltage depends on the specific configuration of the pulse generator 1, that is, depending on whether an AND gate, a NAND gate, a NOR gate, an EXOR gate or a more complex logic function is selected for the logic gate, the logic state which generates the desired behaviour in response to the other control signals is different. By variably controlling the input IP by use of suitable gate types both positive and negative output pulses can be generated.

However, in the following exemplary embodiments the selection is limited to the use of a logic gate of the type NAND Schmitt trigger in FIGS. 3 to 8 or to a composite type of a NAND gate and a Schmitt trigger at an input of the NAND gate in FIGS. 9 and 10.

The components of the first RC element RT1, CT1 which together form a delay time constant can be arranged directly behind one another, as shown in FIGS. 1, 3, 5, 7 and 9.

However, in a further preferred embodiment the components RT1, CT1 can be arranged such that they functionally form a delay time constant, without being directly physically connected to each other as shown in FIGS. 4, 6, 8 and 10. On closer inspection here, of course, a series circuit of CT2 and CT1 is obtained for the delay time constant. However, if the capacitance of CT2 is substantially greater than the capacitance of CT1, both embodiments differ hardly from each other with respect to the effect so that RT1, CT1 are still substantially the defining components for the delay time constant.

For the precharge time constant RT2, CT2 in FIGS. 4, 6, 8 and 10 on closer inspection a parallel circuit of CT2 and CT1 is obtained. However, if the capacitance of CT2 is substantially greater than the capacitance of CT1, then both embodiments differ hardly from each other with respect to the effect so that RT2, CT2 are still substantially the defining components for the precharge time constant.

The advantages of the preferred exemplary embodiments in FIGS. 4, 6, 8 and 10 result from the relatively short intended pulse times and short delay time constants for RT1, CT1 required therefor, which may lie in the range of a few nanoseconds. As a result, with reliably applicable resistance values for RT1 in the range of several kilo ohms relatively small capacitance values in the range of a few picofarads are obtained, which may already result from parasitic input capacitances and therefore are poorly definable. Thus, it is only beneficial if the necessary individual capacitance values for realizing the desired delay time constant by means of the series circuit of CT1 and CT2 can be dimensioned tendentially slightly larger.

In addition, the parasitic input capacitances of the logic gate and the discharge switch exist anyway inevitably parallel to CT1, which can even make the capacitor CT1 dispensable at very short delay times, so that the function of CT1 is already realized by the parasitic capacitances. This is particularly cost-effective.

An expert with experience in the field of analog and digital technique as well in the field of EMC is able to acquire by himself other aspects for the selection of the two arrangement variants according to FIGS. 1, 3, 5, 7 and 9 or according to FIGS. 4, 6, 8 and 10.

Figure 2:
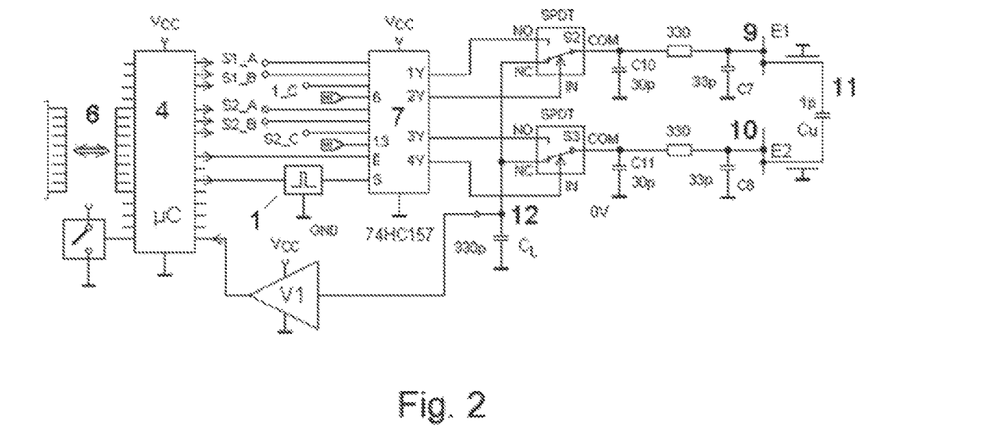
FIG. 2 shows a front circuit for a capacitive sensor with the pulse generator according to the disclosure.

The circuit shown in FIG. 2 is used to determine the capacitances of the electrodes E1 and E2 designated by 9 and 10 against ground. The capacitor Cu represents the mutual capacitance 11 of the two electrodes. Of course, there may be further measuring electrodes.

The charges are converted into pulses with variable amount of charge and transferred to a larger and easier readable capacitor CL which is also designated as charge output 12.

The two electrodes capacity 9 and 10 further include capacitors C7 and C8, respectively, which are connected to the capacitors C10 and C11, respectively, via 330 Ω resistors (useful range: 50 Ω . . . 1 kΩ) shown simplified here.

The electrode capacitances 9 and 10 can be connected to the charge capacitor CL of the charge pulse output 12 or the outputs of the multiplexer 7 (74HC157) via two analog switches S2 and S3.

The multiplexer 7 is provided with the necessary measuring pulses by the single pulse generator 1. The pulse generator 1 and the multiplexer 7 are controlled by a control and evaluation unit 4 which is advantageously implemented as a microcontroller. The analog switches S2 and S3 may be accommodated, for example, in an integrated circuit LVC1G53. The multiplexer 7 can be for example an IC 74(A)HC157. Thus, the two electrodes E1 and E2 can be controlled in phase or in anti-phase and evaluated. The results arising hereby can be output as binary switching or diagnostic signals or as other analog or digital "decision signals", for example, via a bus interface 6. The circuit shown in FIG. 2 is in particular suitable as a door opener for motor vehicles, e.g. also as a trunk or tailgate opener.

Figure 3:
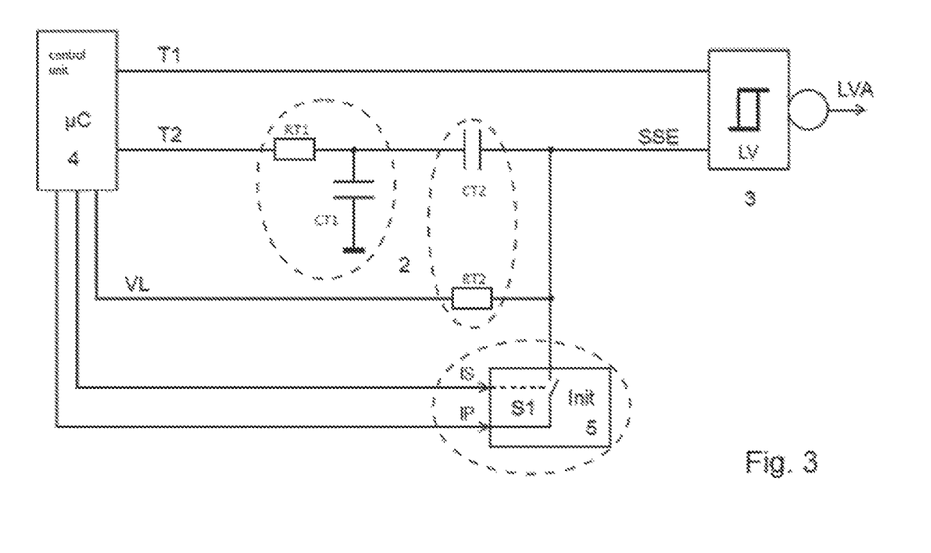
FIGS. 3 to 10 show pulse generators which are suitable for implementing the method according to the disclosure.
Figure 11:
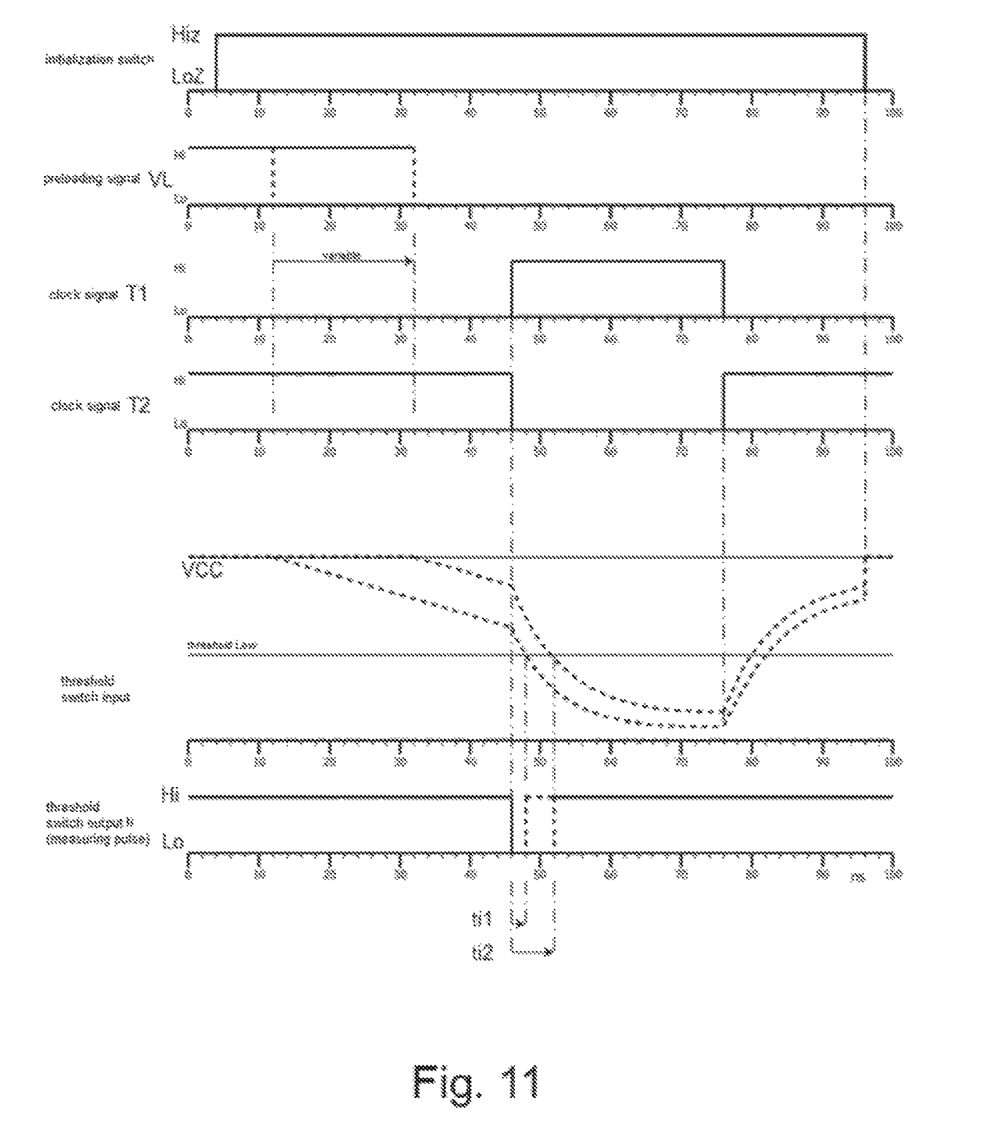
FIG. 11 shows the pulse diagram of the pulse generator 1 shown in FIG. 1.

FIG. 3 shows a pulse generator 1 according to the i disclosure with adjustable pulse duration as a part of the front circuit for a capacitive sensor shown in FIG. 2. The pulse generator 1 according to the disclosure is used to generate measuring pulses in the time range from 10 ns to 200 ns for the above-mentioned circuit. The pulse duration ti1, ti2 of the measuring pulses, as shown in FIG. 11, can be variably adjusted by the control and evaluation unit 7. For this purpose, two clock signals, a time-adjustable precharge signal and a control signal for the initialization switch are required. The precharge time is in the range of 0 . . . 20 μs.

The advantage of the circuit is that the above-mentioned clock and control signals can still be generated precisely by use of a commercially available microcontroller with a clock frequency of less than 20 MHz.

The first clock signal T1 which is generated by the control and evaluation unit 4, is supplied to a first input of the logic gate 3. The second, in this case anti-phase clock signal T2, is provided at the input of a delay circuit 2 and is essentially converted by the time constant RT1, CT1 into an integrating E-function, which appears at the output of the delay circuit 2 and is led from there to the second input of the logic gate 3. The delay circuit 2 has a further, larger time constant RT2, CT2, wherein the capacitor CT2 is supplied with a time-variable precharge signal via the resistor RT2 and the precharge input VL.

The measuring pulses are generated at the output LVA of the logic gate 3. Since the second time constant RT2, CT2 is greater than the first time constant CT1, RT1 an adjustable bias voltage for the second input of the logic gate 3 is generated by this second, slower charging process.

The initialization switch 5, which is also controlled by the control and evaluation unit 4, provides in the state "LoZ" after each measuring pulse which occurs at the output LVA of the logic gate 3 cyclically for the discharge or charge of the delay circuit.

Figure 4:
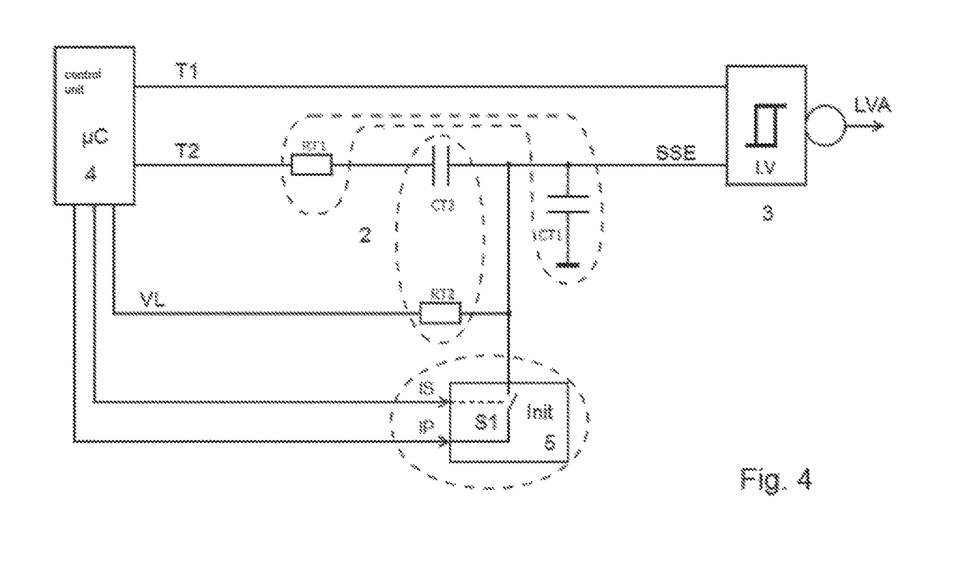

FIG. 4 shows the basic circuit of FIG. 3 but with a preferred, alternative arrangement of CT1.

Figure 5:
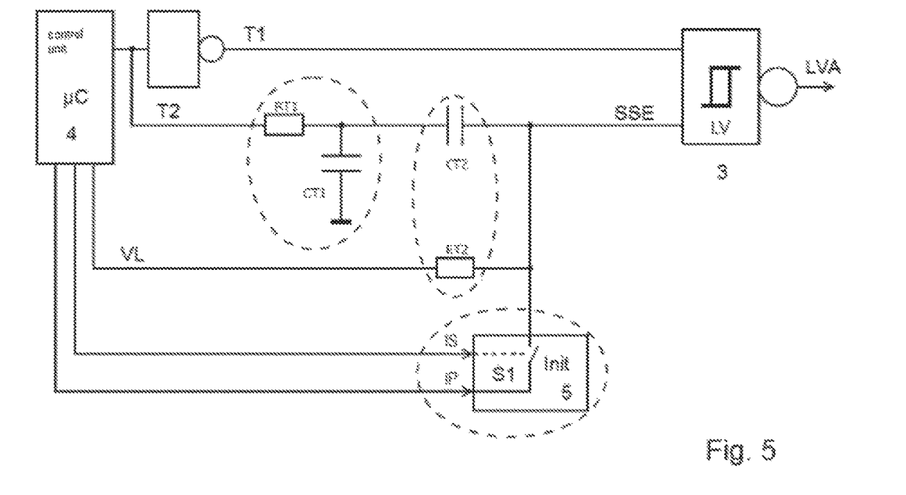

FIG. 5 shows a pulse generator 1 according to the disclosure 1 with only a single clock signal T2 generated by the control unit, while the second clock signal T1 which in this case is required to be anti-phase, is obtained by inverting by means of an inverting element.

Figure 6:
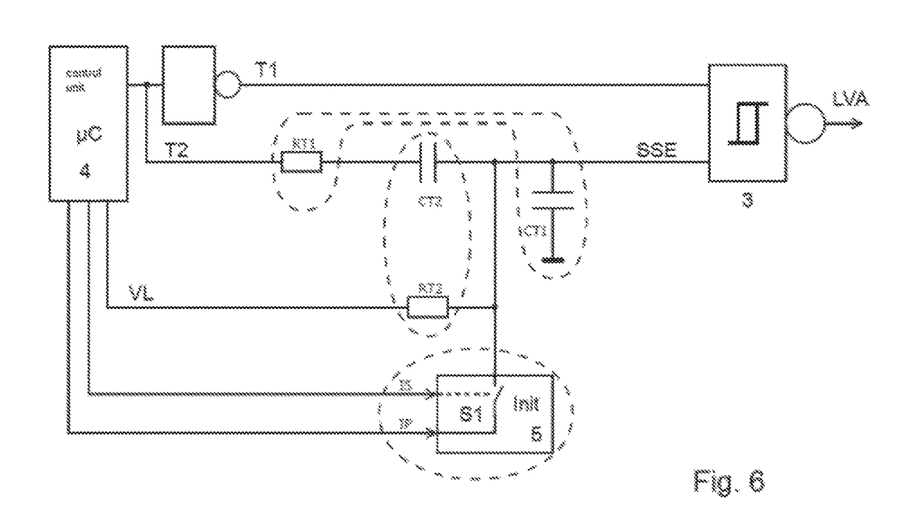

FIG. 6 shows the basic circuit of FIG. 5 but with a preferred, alternative arrangement of CT1.

Figure 7:
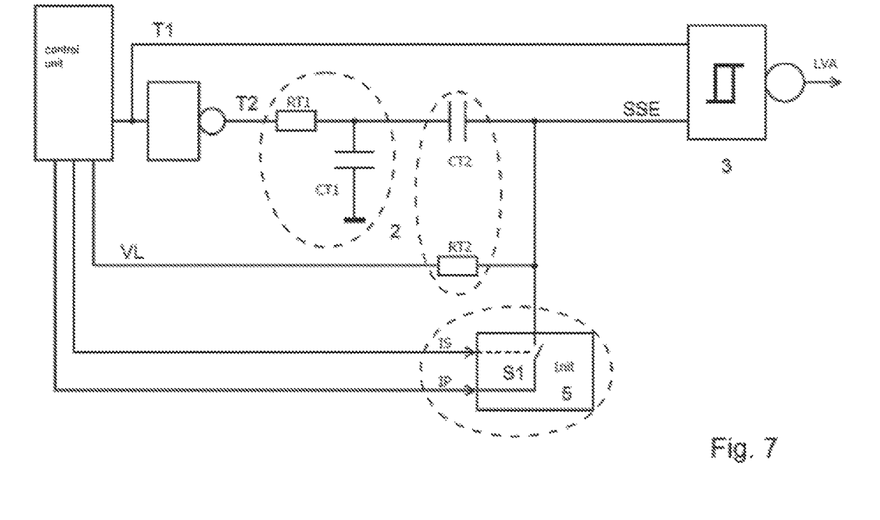

FIG. 7 shows a pulse generator 1 according to the disclosure, wherein the signal supplied to the delay circuit 2 is inverted (T2), while the non-delayed clock signal T1 is generated by the control unit and is led directly to the input of the logic gate 3.

Figure 8:
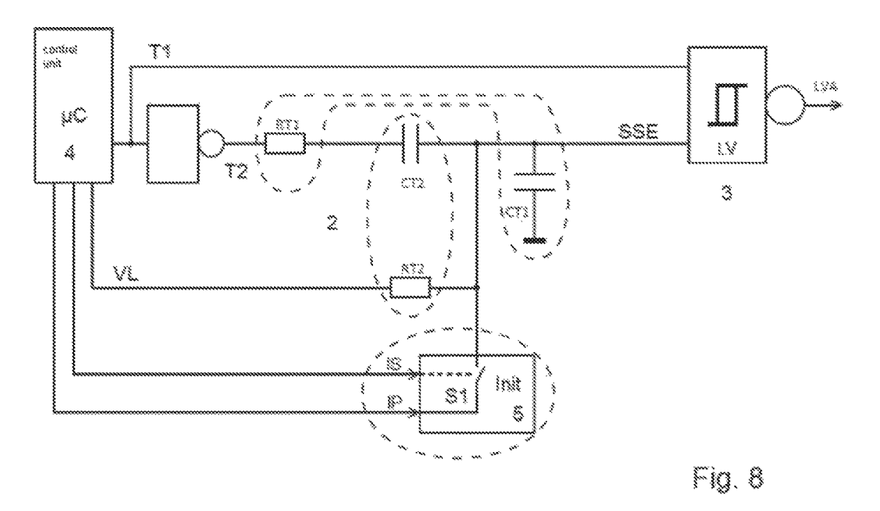

FIG. 8 shows the basic circuit of FIG. 7 but with a preferred, alternative arrangement of CT1.

Figure 9:
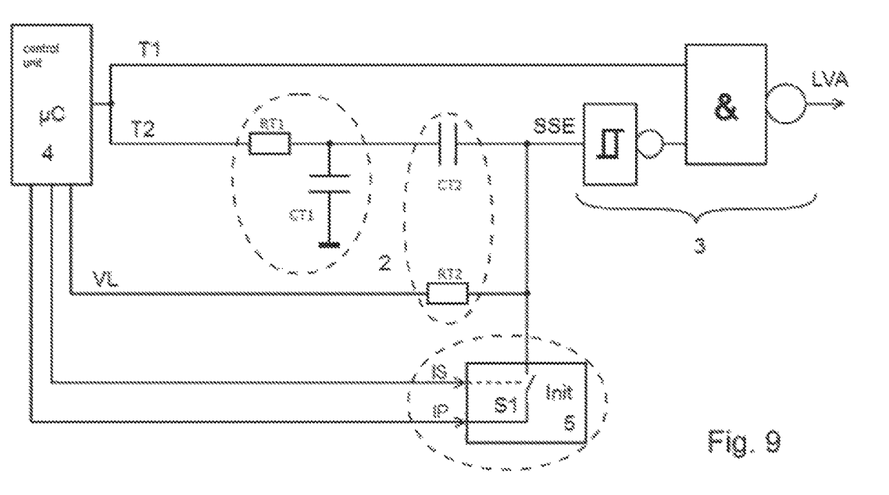

FIG. 9 shows a pulse generator 1 according to the disclosure, wherein two in-phase clock signals T1 and T2 are used, wherein the logic function of the logic gate 3 in this case comprises an inverted input which is realized by an inverting Schmitt trigger.

Figure 10:
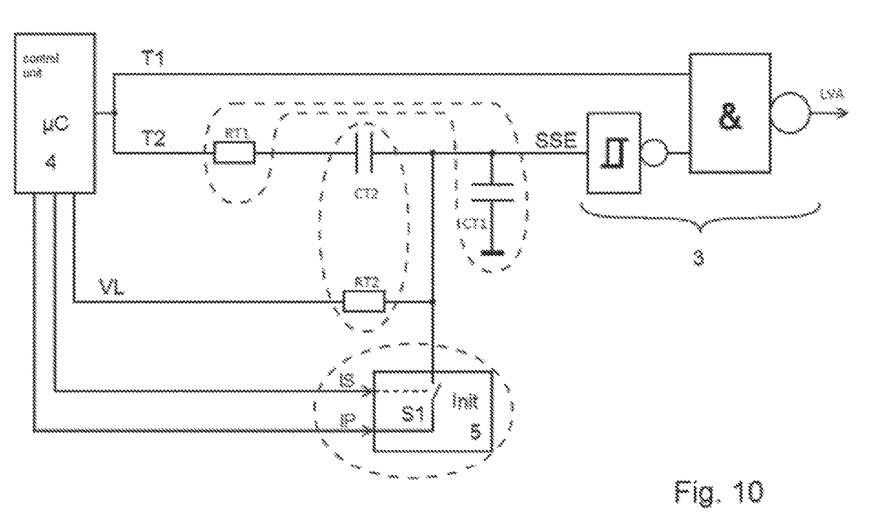

FIG. 10 shows the basic circuit of FIG. 8 but with a preferred, alternative arrangement of CT1.

FIG. 11 shows the pulse diagram of the pulse generator 1 shown in FIGS. 1 and 3.

Prior to each new pulse the delay circuit is discharged or charged by the initialization switch 5, the output state (LoZ=low impedance, HiZ=high impedance) is shown on the uppermost signal line as a function of time.

In the second signal line directly below the precharge signal VL is shown by means of which the delay circuit is precharged. The precharge signal may be variable. Two precharge signals with different length are shown, which according to the disclosure generate different bias voltages at the output of the delay circuit and at the node SSE of the threshold switch input of the logic gate 3.

By means of the positive edge of the first clock signal T1, which is shown in the third signal line of the diagram as "clock signal T1", the output LVA of the logic gate 3 switches from "high" to "low" which is shown in the sixth signal line at "threshold switch output ti". At the same time, the second clock signal T2 which is shown in the fourth signal line of the diagram as "clock signal T2", starts a discharge of CT1 via RT1, which is shown in the fifth signal line. Depending on the delay time constant RT1, CT1 at the node SSE of the threshold switch input of the logic gate 3 a threshold level designated by "threshold low" of the logic gate 3 is undershot, which subsequently, as shown in the sixth signal line, changes its output state again from low to high.

By means of the variable precharge signal VL the delay circuit receives at node SSE a variable bias voltage, whereby the time at which the switching threshold is undershot also varies and thus the desired, variable pulse duration is generated. As can be seen from the two examples shown with different precharge the increase or decrease of the approximately exponential discharge process of CT1 results in different pulse lengths, which here are shown by the two times ti1 and ti2. Subsequently, the output of the delay circuit is recharged by the initialization switch 5 in order to restore a defined initial state.

The method for operating the pulse generator 1 is defined in that
  two simultaneous clock signals T1, T2 are generated,
  the first clock signal T1 drives the first input of a logic gate 3,
  the second clock signal input T2 drives the first input of a delay circuit,
  the delay circuit converts the second clock signal depending on an integrating delay time constant RC1, CT1 into an analog output signal, thereby generating a time delay in the time range from 10 ns to 200 ns,
  the output of the delay circuit is led to the second input of the logic gate 3 which operates as a threshold switch,
  the delay circuit receives a time-variable precharge signal VL at a second input with an integrating precharge time constant RT2, CT2 in a time range of greater 1 µs such that the delay circuit is precharged by an adjustable precharge signal, the output LVA of the logic gate 3 drives the corresponding control input of the capacitive sensor circuit with a variable pulse duration, an initialization switch charges and discharges the output of the delay circuit 2 for cyclically restoring a defined initial state, a controller (microcontroller) 4 provides the following output signals:
at least a first clock signal Takt_1 or T1,
optionally another clock signal Takt_2 or T2,
a time-variable precharge signal VL which drives the precharge input of the delay circuit 2,
a control signal IS which drives the control input of the initialization switch S1,
optionally a control signal IP which defines the voltage potential of the initialization switch 5 (S1)1.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. A method for operating a pulse generator for generating measuring pulses for a capacitive sensor with an adjustable pulse duration in the range from 10 ns to 200 ns, comprising:
a controllable delay circuit which includes a first integrating RC combination (RT1/CT1) and a second integrating RC combination (RT2/CT2), a logic gate with a first input, a second input and one output, an initialization switch and a control unit, wherein the first input of the logic gate receives a first clock signal (T1) and its second input receives an analog adjusting signal (SSE) from the output of the delay circuit,
wherein a second clock signal (T2) is generated simultaneously with the first clock signal (T1), wherein the first clock signal (T1) is supplied without delay to the first input of the logic gate and the second clock signal (T2) is delayed by the delay circuit and supplied to the second input of the logic gate as the analog adjusting signal (SSE); and
the measuring pulses at the output of the logic gate are generated with variable pulse duration by means of time-variable precharge signals (VL) for precharging the second integrating RC combination (RT2/CT2), wherein the output of the delay circuit is discharged or charged after each measuring pulse by the initialization switch.

2. The method of claim 1, wherein the control unit is used to evaluate the measuring pulses and to output a binary switching signal and/or a diagnostic signal.

3. The method of claim 1, wherein the control unit is used to evaluate the measuring pulses and to output a binary switching signal and/or a diagnostic signal via a bus interface.

4. A pulse generator for generating measuring pulses for a capacitive sensor with an adjustable pulse duration in the range from 10 ns to 200 ns, comprising:
a controllable delay circuit which includes a first integrating RC combination (RT1/CT1) and a second integrating RC combination (RT2/CT2),
a logic gate with a first input, a second input and one output,
an initialization switch,
a control unit, and
a clock generation unit for generating first and second clock signals (T1, T2),
wherein the pulse generator is arranged such that the first clock signal (T1) is supplied without delay to the first input of the logic gate and the second clock signal (T2) is delayed by the delay circuit and supplied to the second input of the logic gate as an analog adjusting signal (SSE); and
the measuring pulses at the output of the logic gate are generated with variable pulse duration by means of time-variable precharge signals (VL) for precharging the second integrating RC combination (RT2/CT2), wherein the output of the delay circuit is discharged or charged after each measuring pulse by an initialization switch.

5. The pulse generator according to claim 4, wherein a second time constant (RT2, CT2) is greater than a first time constant (RT1, CT1).

6. The pulse generator according to claim 4, wherein the capacitive sensor is positioned in a motor vehicle.

7. The pulse generator according to claim 4, wherein the clock generation unit is realized by the control unit.

* * * * *